(12) United States Patent
Lee et al.

(10) Patent No.: US 12,411,359 B2
(45) Date of Patent: Sep. 9, 2025

(54) DISPLAY PANEL AND SMART CONTACT LENS INCLUDING THE DISPLAY PANEL

(71) Applicant: Samsung Display Co., Ltd., Yongin-Si (KR)

(72) Inventors: Junghun Lee, Yongin-si (KR); Jiheon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 848 days.

(21) Appl. No.: 17/515,678

(22) Filed: Nov. 1, 2021

(65) Prior Publication Data

US 2022/0269109 A1  Aug. 25, 2022

(30) Foreign Application Priority Data

Feb. 22, 2021  (KR) .......................... 10-2021-0023451

(51) Int. Cl.
*G02C 7/04* (2006.01)
*H10D 86/40* (2025.01)
(Continued)

(52) U.S. Cl.
CPC ............. *G02C 7/04* (2013.01); *H10D 86/441* (2025.01); *H10D 86/443* (2025.01); *H10D 86/60* (2025.01); *H10K 50/844* (2023.02); *H10K 59/00* (2023.02); *H10K 59/1213* (2023.02); *H10K 59/131* (2023.02); *H10K 59/82* (2023.02); *H10K 59/8731* (2023.02); *H10K 2102/311* (2023.02)

(58) Field of Classification Search
CPC .... G02C 7/04; H10K 59/1213; H10K 59/124; H10K 59/131; H10K 59/82; H10K 2102/311; H01L 27/124; H10D 86/441; H10D 86/443; H10D 86/60
See application file for complete search history.

(56) References Cited

U.S. PATENT DOCUMENTS

| | | | |
|---|---|---|---|
| 10,754,178 B2 | 8/2020 | Kim et al. | |
| 2016/0091737 A1* | 3/2016 | Kim | G02C 7/04 156/60 |

(Continued)

FOREIGN PATENT DOCUMENTS

| | | |
|---|---|---|
| KR | 10-2010-0056373 A | 5/2010 |
| KR | 10-2016-0037008 A | 4/2016 |
| KR | 10-2020-0012419 A | 2/2020 |

*Primary Examiner* — Marcos D. Pizarro
(74) *Attorney, Agent, or Firm* — Innovation Counsel LLP

(57) ABSTRACT

A display panel includes: a substrate including a first substrate region, a second substrate region surrounding at least a portion of the first substrate region, and a third substrate region being arranged between the first substrate region and the second substrate region and including a plurality of through portions spaced apart from each other; a display element arranged in the first substrate region, a connection wiring electrically connected to the display element and extending from the first substrate region to the second substrate region, and a pixel circuit arranged in the second substrate region, electrically connected to the connection wiring. An edge of the substrate that defines at least a portion of one of the plurality of through portions extends from the first substrate region to the second substrate region, and an extension direction of the edge changes at least twice in the third substrate region.

20 Claims, 12 Drawing Sheets

(51) Int. Cl.
    *H10D 86/60*     (2025.01)
    *H10K 50/844*     (2023.01)
    *H10K 59/00*     (2023.01)
    *H10K 59/121*     (2023.01)
    *H10K 59/131*     (2023.01)
    *H10K 59/80*     (2023.01)
    *H10K 59/82*     (2023.01)
    *H10K 102/00*     (2023.01)

(56) References Cited

U.S. PATENT DOCUMENTS

2017/0235158 A1\*   8/2017   Markus .................. G02C 7/083
                                                                                                                        351/159.03
2020/0037442 A1     1/2020   Keum et al.
2022/0028949 A1\*   1/2022   Ko ....................... H10K 59/123

\* cited by examiner

DISPLAY PANEL AND SMART CONTACT LENS INCLUDING THE DISPLAY PANEL

CROSS-REFERENCE TO RELATED APPLICATION

This application is based on and claims priority under 35 U.S.C. § 119 to Korean Patent Application No. 10-2021-0023451, filed on Feb. 22, 2021, in the Korean Intellectual Property Office, the disclosure of which is incorporated by reference herein in its entirety.

BACKGROUND

1. Field

One or more embodiments relate to a display panel and a smart contact lens including the same.

2. Description of the Related Art

Mobile electronic apparatuses are widely used. As mobile electronic apparatuses, electronic apparatuses including head mounted displays (HMDs) that are mounted on a user's head to allow the user to experience augmented reality (AR) have been recently developed in addition to portable electronic apparatuses such as mobile phones.

However, regarding the HMDs, the quality of an image may be influenced by the movement of a user who wears the HMD and a viewing angle may be narrow, and thus, use of the HMD may be insufficient for implementing AR.

Recently, to implement AR, a smart contact lens that is directly attached to user's eyes has been developed. The smart contact lens may include a display panel to display an image to a user.

SUMMARY

One or more embodiments include a display panel with an increased light transmittance and a smart contact lens including the display panel.

Additional aspects will be set forth in part in the description which follows and, in part, will be apparent from the description, or may be learned by practice of the presented embodiments of the disclosure.

According to one or more embodiments, a display panel includes a substrate including a first substrate region, a second substrate region, and a third substrate region, the second substrate region surrounding at least a portion of the first substrate region, and the third substrate region being arranged between the first substrate region and the second substrate region and including a plurality of through portions spaced apart from each other, a display element arranged in the first substrate region, a connection wiring electrically connected to the display element and extending from the first substrate region to the second substrate region, and a pixel circuit arranged in the second substrate region, electrically connected to the connection wiring, and including at least one thin-film transistor and a storage capacitor, wherein an edge of the substrate that defines at least a portion of one of the plurality of through portions extends from the first substrate region to the second substrate region, and an extension direction of the edge changes at least twice in the third substrate region.

The display panel may further include a conductive pattern arranged in the first substrate region and electrically connected to the display element, wherein the conductive pattern may be electrically connected to the connection wiring and a light transmittance of the conductive pattern may be greater than a light transmittance of the connection wiring.

The display panel may further include a data line configured to transfer a data signal, and a scan line configured to transfer a scan signal, wherein the at least one thin-film transistor may include a switching thin-film transistor electrically connected to the data line and the scan line, and a driving thin-film transistor electrically connected to the switching thin-film transistor and the connection wiring.

The connection wiring may be provided in a plurality, and the plurality of connection wirings may each extend from the first substrate region to the second substrate region.

The display element may be provided in a plurality and the plurality of display elements may each include a pixel electrode, an intermediate layer, and an opposite electrode, and the opposite electrode of each of the plurality of display elements may be provided as one body and be electrically connected to one of the plurality of connection wirings.

The connection wiring may extend in a serpentine shape.

The display panel may further include an encapsulation layer covering the display element and including a first inorganic encapsulation layer, an organic encapsulation layer, and a second inorganic encapsulation layer that are sequentially stacked.

The first encapsulation layer and the second encapsulation layer may not overlap the third substrate region.

The display panel may further include an inorganic insulating layer arranged between the substrate and the display element, wherein the inorganic insulating layer may include an opening that overlaps the third substrate region.

The display panel may further include an organic layer covering the opening, wherein the connection wiring may be arranged on the organic layer.

According to one or more embodiments, a smart contact lens includes a first contact lens including an upper surface that includes a first region and a second region surrounding the first region, and a display panel arranged on the upper surface of the first contact lens, wherein the display panel includes a substrate including a first substrate region and a second substrate region, the first substrate region overlapping the first region, and the second substrate region overlapping the second region, a display element arranged in the first substrate region, a connection wiring electrically connected to the display element and extending from the first substrate region to the second substrate region, and a pixel circuit arranged in the second substrate region, electrically connected to the connection wiring, and including at least one thin-film transistor and a storage capacitor, wherein the connection wiring is provided in a plurality, and the plurality of connection wirings each extend from the first substrate region to the second substrate region.

The display panel may further include a conductive pattern arranged in the first substrate region and electrically connected to the display element, the conductive pattern may be electrically connected to the connection wiring, and a light transmittance of the conductive pattern may be greater than a light transmittance of the connection wiring.

The plurality of connection wirings may each extend in a serpentine shape from the first substrate region to the second substrate region.

The display element may be provided in a plurality and the plurality of display elements may each include a pixel electrode, an intermediate layer, and an opposite electrode, and the opposite electrode of each of the plurality of display elements may be provided as one body and be electrically connected to one of the plurality of connection wirings.

The display panel may further include a data line and a scan line, the data line being configured to transfer a data signal, and the scan line being configured to transfer a scan signal, and the at least one thin-film transistor may include a switching thin-film transistor electrically connected to the data line and the scan line, and a driving thin-film transistor electrically connected to the switching thin-film transistor and the connection wiring.

The upper surface of the first contact lens may further include a third region arranged between the first region and the second region, the substrate may further include a third substrate region overlapping the third region, the third substrate region may include a plurality of through portions spaced apart from each other, an edge of the substrate that defines at least a portion of one of the plurality of through portions extends from the first substrate region to the second substrate region, and an extension direction of the edge changes at least twice in the third substrate region.

The upper surface of the first contact lens may further include a third region arranged between the first region and the second region, the substrate may further include a third substrate region overlapping the third region, the display panel may further include an inorganic insulating layer arranged between the substrate and the display element, and the inorganic insulating layer may include an opening that overlaps the third substrate region.

The smart contact lens may further include a radio frequency antenna arranged in the second region, and a battery arranged in the second region.

The smart lens may further include a second contact lens covering the display panel, wherein the second contact lens may include a transmission area and a peripheral area, the transmission area overlapping the first region, and the peripheral area overlapping the second region, and a light transmittance of the second contact lens in the transmission area may be greater than a light transmittance of the second contact lens in the peripheral area.

The first contact lens may include elastomer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
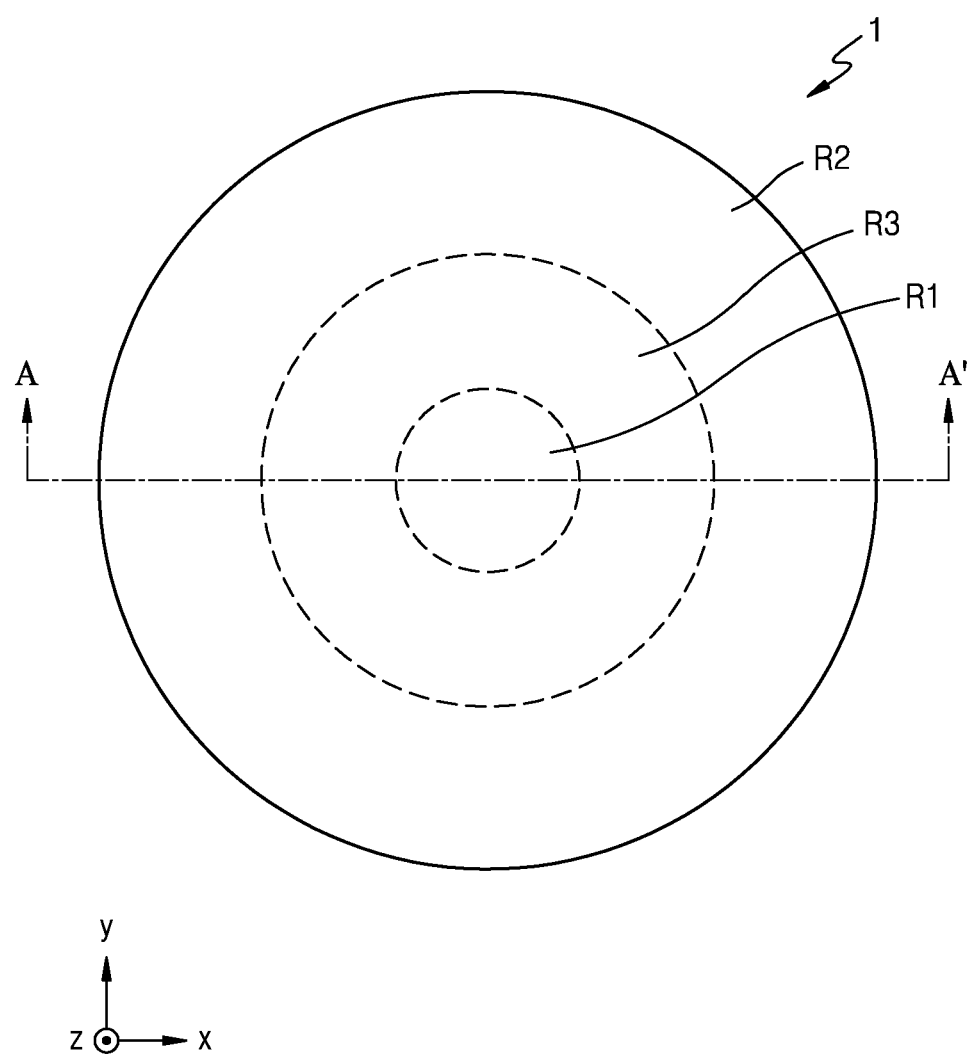
FIG. 1 is a plan view of a smart contact lens according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

When an embodiment may be implemented differently, a certain process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Figure 2:
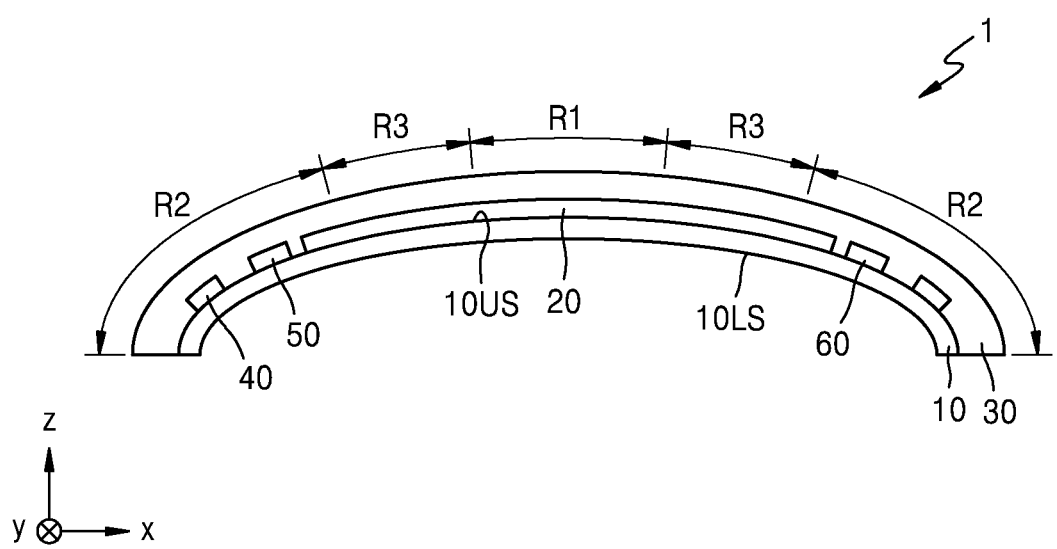
FIG. 2 is a cross-sectional view of a smart contact lens according to an embodiment, taken along line A-A' of FIG. 1.

FIG. 1 is a plan view of a smart contact lens 1 according to an embodiment. FIG. 2 is a cross-sectional view of the smart contact lens 1 according to an embodiment, taken along line A-A' of FIG. 1.

Referring to FIGS. 1 and 2, the smart contact lens 1 may implement augmented reality. In an embodiment, the smart contact lens 1 may directly contact a user's eye. The smart contact lens 1 may include a first contact lens 10, a display panel 20, a second contact lens 30, a radio frequency (RF) antenna 40, a battery 50, and a controller 60.

The first contact lens 10 may include a lower surface 10LS and an upper surface 10US. In an embodiment, the lower surface 10LS of the first contact lens 10 may be a surface directly contacting a user's eye. The upper surface 10US of the first contact lens 10 may be a surface opposite to the lower surface 10LS of the first contact lens 10. In an embodiment, the upper surface 10US of the first contact lens 10 may include a first region R1, a second region R2, and a third region R3 interposed between the first region R1 and the second region R2.

The first region R1 may overlap the center of the upper surface 10US of the first contact lens 10. In an embodiment, when a user wears the smart contact lens 1, the first region R1 may be a region overlapping a user's pupil. The second region R2 may surround at least a portion of the first region R1. In an embodiment, the second region R2 may completely surround the first region R1. The third region R3 may be arranged between the first region R1 and the second region R2. The third region R3 may surround at least a portion of the first region R1. In an embodiment, the third region R3 may completely surround the first region R1. The second region R2 may surround the third region R3. The second region R2 may completely surround the third region R3. In an embodiment, when a user wears the smart contact lens 1, the second region R2 and the third region R3 may overlap at least a portion of a user's iris. In an embodiment, a light transmittance of the smart contact lens 1 in the first region R1 may be greater than a light transmittance of the smart contact lens 1 in the second region R2.

The first contact lens 10 may include elastomer. As an example, the first contact lens 10 may include a polymer material representing rubber elasticity. In an embodiment, the first contact lens 10 may include a synthetic resin. As an example, the first contact lens 10 may include at least one of polyolefine, polyvinyl chloride, elastomeric silicone, elastomeric polyurethane, and elastomeric polyisoprene. Accordingly, the first contact lens 10 may be stretchable and/or contractable.

The display panel 20 may display an image. The display panel 20 may include a plurality of display elements and the plurality of display elements emit light to display an image. In an embodiment, light may pass through the display panel 20. Accordingly, when a user wears the smart contact lens 1, the smart contact lens 1 may implement augmented reality.

The display panel 20 may be arranged on the upper surface 10US of the first contact lens 10. In an embodiment, the display panel 20 may overlap the first region R1, the second region R2, and the third region R3. The center of the display panel 20 may overlap the first region R1. In an embodiment, the first contact lens 10 may include a groove such that the display panel 20 is disposed in the groove.

A light transmittance of the display panel 20 in the first region R1 may be greater than a light transmittance of the display panel 20 in the second region R2. In an embodiment, the display panel 20 may include a display element and a pixel circuit electrically connected to the display element. The pixel circuit may drive the display element. In the case where both the pixel circuit and the display element are arranged in the first region R1, a light transmittance of the display panel 20 may decrease. In an embodiment, the display element may be arranged in the first region R1, and the pixel circuit may be arranged in the second area R2. In this case, the display panel 20 may include connection wiring electrically connecting the pixel circuit that overlaps the third region R3 to the display element disposed in the first region R1. Accordingly, a light transmittance of the display panel 20 that overlaps the first region R1 may increase.

The second contact lens 30 may cover the display panel 20. In an embodiment, the second contact lens 30 may cover the display panel 20, the RF antenna 40, the battery 50, and the controller 60.

In an embodiment, a light transmittance of the second contact lens 30 that overlaps the first region R1 may be greater than a light transmittance of the second contact lens 30 that overlaps the second region R2. Accordingly, elements such as a portion of the display panel 20, the RF antenna 40, the battery 50, and the controller 60 arranged inside the smart contact lens 1 may be prevented or reduced from being viewed from the outside, and thus, an aesthetic sense of the smart contact lens 1 may be increased.

The second contact lens 30 may include elastomer. As an example, the second contact lens 30 may include a polymer material representing rubber elasticity. In an embodiment, the second contact lens 30 may include a synthetic resin. As an example, the second contact lens 30 may include at least one of polyolefine, polyvinyl chloride, elastomeric silicone, elastomeric polyurethane, and elastomeric polyisoprene. Accordingly, the second contact lens 30 may be stretchable and/or contractable.

The RF antenna 40 may exchange information with an external apparatus. In an embodiment, the RF antenna 40 may receive wireless power from an external apparatus. The external apparatus may be an apparatus in which a program for operating the smart contact lens 1 is installed. The external apparatus may be a portable apparatus or a stand-alone apparatus. The portable apparatus may be a mobile communication apparatus. The RF antenna 40 may be arranged in the second region R2 of the first contact lens 10.

The battery 50 may supply power to the display panel 20. The battery 50 may supply power to an element other than the display panel 20, for example, the controller 60. In an embodiment, the battery 50 may be wirelessly charged. The battery 50 may be arranged in the second region R2 of the first contact lens 10. In an embodiment, the display panel 20 and/or the controller 60 may receive power from the RF antenna 40 through a wireless power transfer method.

The controller 60 may control an operation of the display panel 20. The controller 60 may control a process in which information received from the outside is transferred to the display panel 20. The controller 60 may process the information into a form that is processible by the display panel 20 while transferring the information received from the outside to the display panel 20. The controller 60 may include a circuit configured to control operations of the display panel 20, the RF antenna 40, and the battery 50.

In an embodiment, the smart contact lens 1 may further include a motion sensor configured to sense the movement of a user's eyeball or the flickering of an eye. In an embodiment, the smart contact lens 1 may further include a camera. The camera may operate in cooperation with the motion sensor. As an example, the movement of a user's eyeball may be sensed by the motion sensor and an object or a background on which the eyeball is focused may be photographed.

Figure 3:
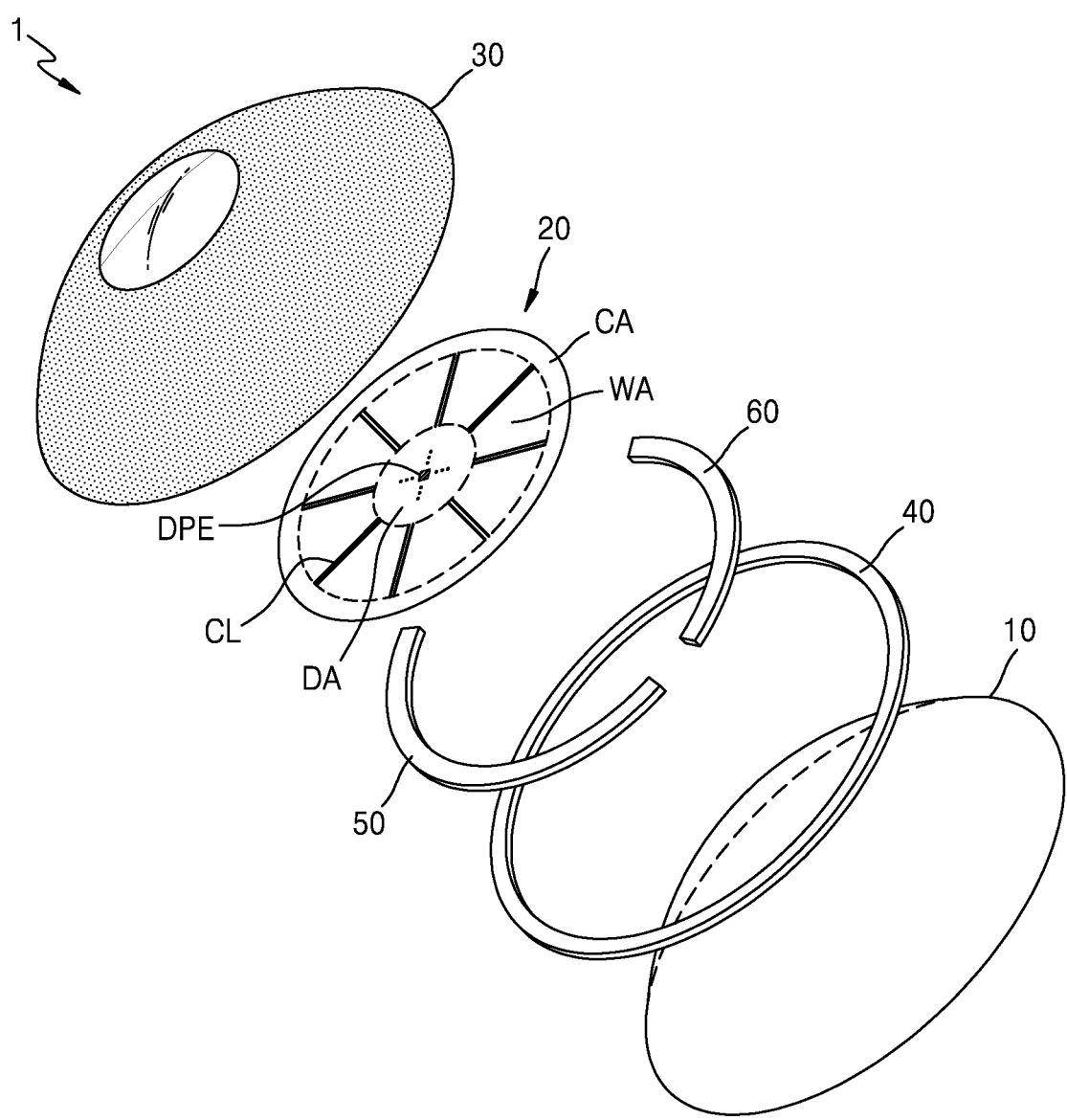
FIG. 3 is an exploded perspective view of a smart contact lens according to an embodiment.
Figure 4:
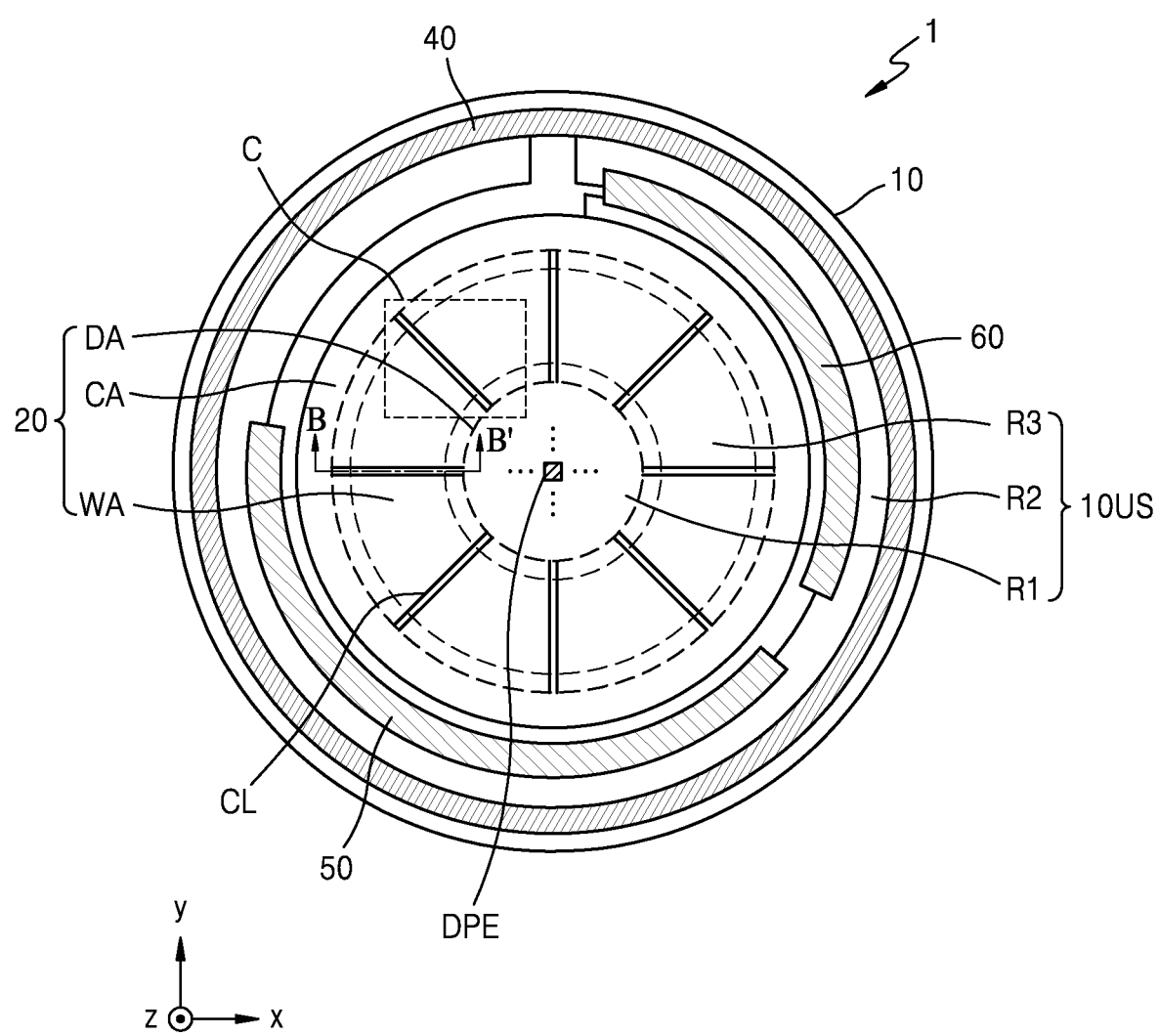
FIG. 4 is a plan view of a smart contact lens according to an embodiment.

FIG. 3 is an exploded perspective view of the smart contact lens 1 according to an embodiment. FIG. 4 is a plan view of the smart contact lens 1 according to an embodiment. FIG. 4 shows the smart contact lens 1 in which a second contact lens is omitted.

Referring to FIGS. 3 and 4, the smart contact lens 1 may include the first contact lens 10, the display panel 20, the second contact lens 30, the RF antenna 40, the battery 50, and the controller 60.

The first contact lens 10 may include the upper surface 10US on which the display panel 20 is arranged. The upper surface 10US of the first contact lens 10 may include the first region R1, the second region R2, and the third region R3. The first region R1 may overlap the center of the upper surface 10US of the first contact lens 10. The second region R2 may surround the first region R1. The third region R3 may be arranged between the first region R1 and the second region R2.

The display panel 20 may be arranged on the upper surface 10US of the first contact lens 10. In an embodiment, the display panel 20 may overlap the first region R1, the second region R2, and the third region R3. The display panel 20 may include a display area DA, a circuit area CA, and a wiring area WA.

The display area DA may be an area on which an image is displayed. A display element DPE may be arranged in the display area DA. In an embodiment, the display element DPE may be an organic light-emitting diode including an organic emission layer. Alternatively, the display element DPE may be a light-emitting diode LED. The size of the light-emitting diode LED may be a micro scale or a nano scale. As an example, the light-emitting diode may be a micro light-emitting diode. Alternatively, the light-emitting diode may be a nanorod light-emitting diode. The nanorod light-emitting diode may include gallium nitride (GaN). In an embodiment, a color-converting layer may be arranged on the nanorod light-emitting diode. The color-converting layer may include quantum dots. Alternatively, the display element DPE may be a quantum-dot light-emitting diode including quantum-dot emission layer. Alternatively, the display element DPE may be an inorganic light-emitting diode including an inorganic semiconductor.

A pixel circuit may be arranged in the circuit area CA, the pixel circuit being configured to control the display element DPE. In an embodiment, the pixel circuit may include at least one thin-film transistor and a storage capacitor. The display element DPE may be electrically connected to the pixel circuit. The display element DPE may be electrically connected to the pixel circuit through the connection wiring CL.

The circuit area CA may be arranged in the second area R2. The circuit area CA may surround at least a portion of the display area DA. In an embodiment, the circuit area CA may entirely surround the display area DA. In another embodiment, the circuit area CA may surround only a portion of the display area DA.

The circuit area CA may not overlap the display area DA. In the case where the circuit area CA overlaps the display area DA, the display element DPE may be arranged on the pixel circuit. In this case, a light transmittance of the display area DA may be reduced. In an embodiment, because the circuit area CA does not overlap the display area DA, a light transmittance of the display area DA may increase. Accordingly, a light transmittance of the smart contact lens 1 in the first region R1 may increase.

The wiring area WA may be arranged between the display area DA and the circuit area CA. The wiring area WA may surround at least a portion of the display area DA. In an embodiment, the wiring area WA may entirely surround the display area DA. In another embodiment, the wiring area WA may surround only a portion of the display area DA.

The connection wiring CL may be arranged in the wiring area WA. The connection wiring CL may electrically connect the display element DPE to the pixel circuit. The connection wiring CL may be configured to transfer a signal and/or power to the display element DPE. The connection wiring CL may be arranged between the display area DA and the circuit area CA. That is, the connection wiring CL may be arranged in the third region R3 of the first contact lens 10. The connection wiring CL may extend from the display area DA to the circuit area CA.

The connection wiring CL may be provided in a plurality. The plurality of connection wirings CL may each extend from the display area DA to the circuit area CA. In an embodiment, the plurality of connection wirings CL may extend in a radial shape. The plurality of connection wirings CL may each extend to the circuit area CA arranged outside the display area DA. Accordingly, an embodiment may efficiently utilize an outer area outside the display area DA.

The RF antenna 40, the battery 50, and the controller 60 may be arranged in the second region R2. In an embodiment, the RF antenna 40 may be electrically connected to the battery 50. In an embodiment, the RF antenna 40 may be electrically connected to the controller 60. In an embodiment, the controller 60 may be electrically connected to at least one of the display panel 20, the RF antenna 40, and the battery 50. The controller 60 may control the operations of the display panel 20, the RF antenna 40, and the battery 50.

Figure 5:
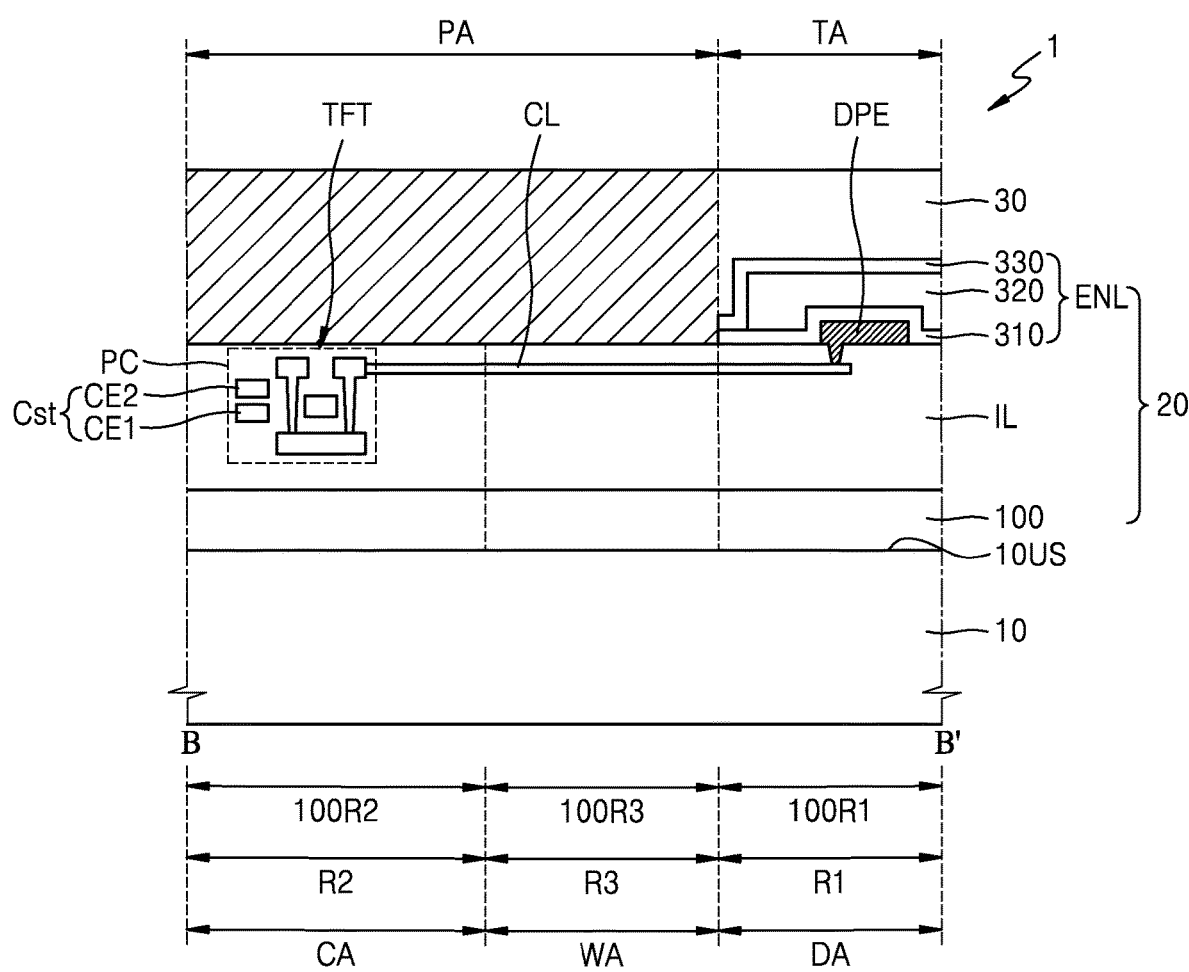
FIG. 5 is a cross-sectional view of the smart contact lens of FIG. 4, taken along line B-B'.

FIG. 5 is a cross-sectional view of the smart contact lens 1 of FIG. 4, taken along line B-B'. It is shown in FIG. 5 that the upper surface 10US of the first contact lens 10 extends in one direction.

Referring to FIG. 5, the smart contact lens 1 may include the first contact lens 10, the display panel 20, and the second contact lens 30. The first contact lens 10 may include the upper surface 10US including the first region R1, the second region R2, and the third region R3.

The display panel 20 may be arranged on the upper surface 10US of the first contact lens 10. The display panel 20 may include a substrate 100, an insulating layer IL, the display element DPE, the connection wiring CL, a pixel circuit PC, and an encapsulation layer ENL.

The substrate 100 may be arranged on the upper surface 10US of the first contact lens 10. In an embodiment, the substrate 100 may be arranged along the shape of the upper surface 10US of the first contact lens 10. In an embodiment, the substrate 100 may include a first substrate region 100R1, a second substrate region 100R2, and a third substrate region 100R3. The first substrate region 100R1 may overlap the first region R1. The second substrate region 100R2 may overlap the second region R2. The third substrate region 100R3 may overlap the third region R3.

The substrate 100 may include glass or a polymer resin including polyethersulfone, polyarylate, polyetherimide, polyethylene naphthalate, polyethylene terephthalate, polyphenylene sulfide, polyimide, polycarbonate, cellulose tri acetate, and cellulose acetate propionate. The substrate 100 including the polymer resin may be flexible, rollable, and bendable. The substrate 100 may have a multi-layered structure including a base layer and a barrier layer including the polymer resin.

The insulating layer IL may be arranged on the substrate 100. The insulating layer IL may include an inorganic material and/or an organic material. In an embodiment, the insulating layer IL arranged on the first substrate region 100R1 may include an inorganic material and/or an organic material. The insulating layer IL arranged on the second substrate region 100R2 may include an inorganic material and/or an organic material. The insulating layer IL arranged on the third substrate region 100R3 may include an organic material. In an embodiment, the insulating layer IL arranged on the third substrate region 100R3 may include an inorganic material and/or an organic material.

An elongation rate of the display panel 20 in the third region R3 may be greater than an elongation rate of the display panel 20 in the first region R1. In the present specification, an elongation rate may be defined as a degree of elongation when constant tensile force is applied to the display panel 20. When constant tensile force is applied to the display panel 20, a degree of the display panel 20 elongated along the third region R3 may be greater than a degree of the display panel 20 elongated along the first region R1. In this case, the display panel 20 in the third region R3 is bent along the shape of the upper surface 10US of the first contact lens 10. A damage to the display panel 20 may be prevented or reduced due to the high degree of elongation of the third region R3.

The display element DPE may be arranged in the first substrate region 100R1. Accordingly, the first region R1 of the first contact lens 10 and the first substrate region 100R1 of the substrate 100 may overlap the display area DA of the display panel 20.

The connection wiring CL may be electrically connected to the display element DPE. The connection wiring CL may be configured to transfer a signal or power to the respective display element DPE. The connection wiring CL may extend from the first substrate region 100R1 to the second substrate region 100R2. The connection wiring CL may overlap the third substrate region 100R3. The third region R3 of the first contact lens 10 and the third substrate region 100R3 of the substrate 100 may overlap the wiring area WA of the display panel 20.

The pixel circuit PC may be electrically connected to the connection wiring CL. The pixel circuit PC may be configured to control the display element DPE through the connection wiring CL. The pixel circuit PC may be arranged in the second substrate region 100R2. In an embodiment, the pixel circuit PC may not overlap the first substrate region 100R1. Accordingly, a light transmittance of the first substrate region 100R1 may be improved. The pixel circuit PC may include at least one thin-film transistor and a storage capacitor Cst.

At least one thin-film transistor TFT may be arranged in the second substrate region R2. The insulating layer IL may be arranged over and below an element of the at least one thin-film transistor TFT. In an embodiment, the at least one thin-film transistor TFT may be electrically connected to the connection wiring CL.

The storage capacitor Cst may be arranged in the second substrate region 100R2. The storage capacitor Cst may include a bottom electrode CE1 and a top electrode CE2. The bottom electrode CE1 may overlap the top electrode CE2. A portion of the insulating layer IL may be arranged between the bottom electrode CE1 and the top electrode CE2. In an embodiment, the at least one thin-film transistor TFT may not overlap the storage capacitor Cst. In another embodiment, the at least one thin-film transistor TFT may overlap the storage capacitor Cst.

The encapsulation layer ENL may cover the display element DPE. In an embodiment, the encapsulation layer ENL may include at least one inorganic encapsulation layer and at least one organic encapsulation layer. The at least one inorganic encapsulation layer may include at least one inorganic material from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include an acryl-based resin, an epoxy-based resin, polyimide, and polyethylene. In an embodiment, the at least one organic encapsulation layer may include acrylate.

In an embodiment, the encapsulation layer ENL may include a first inorganic encapsulation layer 310, an organic encapsulation layer 320, and a second inorganic encapsulation layer 330 that are sequentially stacked. In an embodiment, the first inorganic encapsulation layer 310 may contact the second inorganic encapsulation layer 330. The first inorganic encapsulation layer 310 and the second inorganic encapsulation layer 330 may prevent or reduce the exposure of the organic encapsulation layer 320 and/or the display element DPE to foreign substance such as moisture. In an embodiment, the first inorganic encapsulation layer 310 and the second inorganic encapsulation layer 330 may be disconnected in the first substrate region 100R1. That is, the first inorganic encapsulation layer 310 and the second inorganic encapsulation layer 330 may not overlap the third substrate region 100R3. Accordingly, the display panel 20 in the wiring area WA may be configured to reduce stress due to bending and/or elongation.

In another embodiment, the encapsulation layer ENL may have a structure in which the substrate 100 is coupled to an upper substrate, which is a transparent member, through a sealing member, and thus, an inner space between the substrate 100 and the upper substrate is sealed. In this case, a moisture absorbent or a filler may be arranged in the inner space. The sealing member may be sealant. In another embodiment, the sealing member may include a material hardened by a laser. As an example, the sealing member may be frit. In detail, the sealing member may include a urethane-based resin, an epoxy-based resin, an acryl-based resin, which are organic sealants, or silicone, etc. which are inorganic sealants. As a urethane-based resin, urethane acrylate, etc. may be used for example. As an acryl-based resin, butyl acrylate, ethylhexyl acrylate, etc. may be used for example. The sealing member may include a material hardened by heat.

In an embodiment, the display panel 20 may further include an anti-reflection layer (not shown) arranged on the encapsulation layer ENL. The anti-reflection layer may include a polarizing film. The polarizing film may include a retardation film such as a linear polarizing plate and λ/4 (quarter-wave plate). The retardation film may be arranged on the encapsulation layer ENL, and the linear polarizing plate may be arranged on the retardation film.

In an embodiment, the anti-reflection layer may include a light-blocking layer and/or a filter layer including color filters. The color filters may be selected by considering colors emitted from display elements DPE. As an example, the filter layer may include red, green, or blue color filter.

The second contact lens 30 may cover the display panel 20. The second contact lens 30 may include a transmission area TA and a peripheral area PA. The transmission area TA of the second contact lens 30 may overlap the first region R1 of the first contact lens 10, and the peripheral area PA of the second contact lens 30 may overlap the second region R2 of the first contact lens 10. In an embodiment, the peripheral area PA of the second contact lens 30 may overlap the third region R3 of the first contact lens 10.

In an embodiment, a light transmittance of the second contact lens 30 in the transmission area TA may be higher than a light transmittance of the second contact lens 30 in the peripheral area PA. In an embodiment, the second contact lens 30 in the peripheral area PA may at least partially absorb external light or inner reflected light. As an example, the second contact lens 30 may include black pigment in the peripheral area PA. Accordingly, the smart contact lens 1 may have a relatively high light transmittance in the first region R1. The smart contact lens 1 may have a relatively low light transmittance in the second region R2 and/or the third region R3. In this case, elements arranged inside the smart contact lens 1, for example, the pixel circuit PC and/or the connection wiring CL may not be viewed from the outside, and thus, aesthetic sense of the smart contact lens 1 may be improved.

Figure 6:
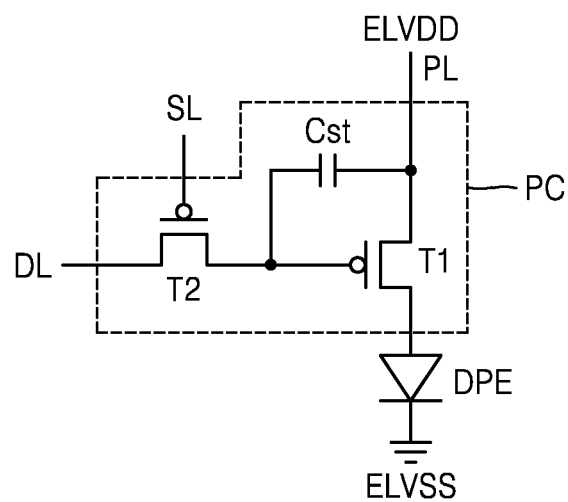
FIG. 6 is an equivalent circuit diagram of a pixel circuit electrically connected to a display element according to an embodiment.

FIG. 6 is an equivalent circuit diagram of a pixel circuit PC electrically connected to a display element DPE according to an embodiment.

Referring to FIG. 6, the pixel circuit PC may include a driving thin-film transistor T1, a switching thin-film transistor T2, and a storage capacitor Cst.

The switching thin-film transistor T2 may be electrically connected to a scan line SL and a data line DL and configured to transfer a data signal or a data voltage to the driving thin-film transistor T1 in response to a scan signal or a switching voltage input from the scan line SL, the data signal being input from the data line DL. The storage capacitor Cst may be electrically connected between the switching thin-film transistor T2 and a driving voltage line PL and configured to store a voltage corresponding to a difference between a voltage transferred from the switching thin-film transistor T2 and a first power voltage ELVDD supplied from the driving voltage line PL.

The driving thin-film transistor T1 may be electrically connected to the driving voltage line PL and the storage capacitor Cst and configured to control a driving current from the driving voltage line PL to the display element DPE according to the voltage stored in the storage capacitor Cst. The display element DPE may emit light having a preset brightness based on the driving current. An opposite electrode of the display element DPE may receive a second power voltage ELVSS.

Though it is shown in FIG. 6 that the pixel circuit PC includes two thin-film transistors and one storage capacitor, the pixel circuit PC may include three, four, five or more thin-film transistors.

Figure 7:
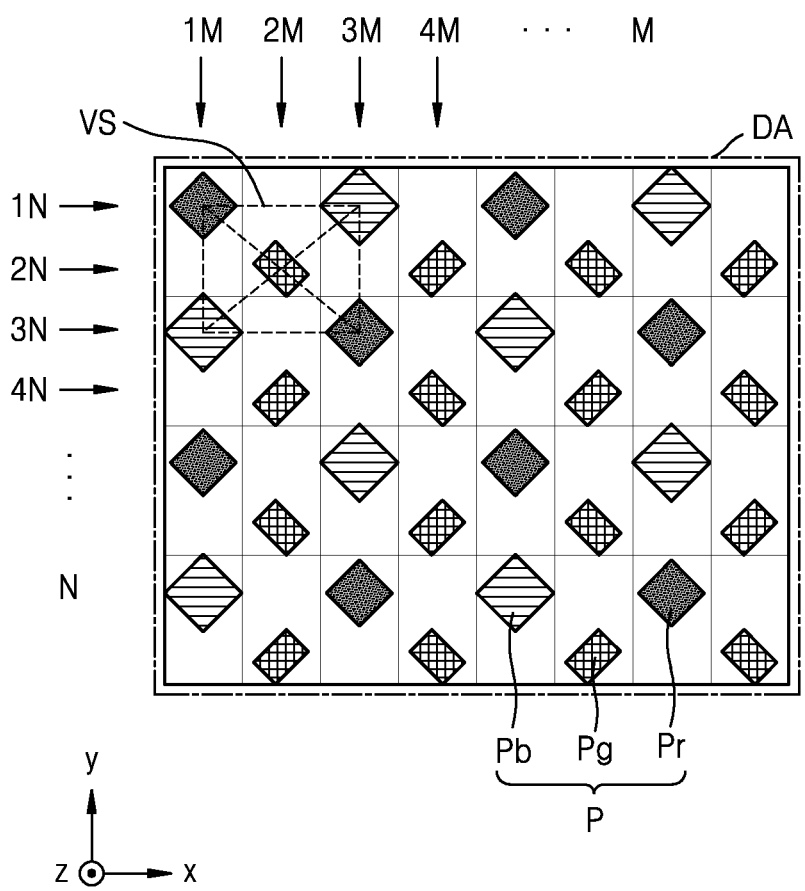
FIG. 7 is a layout view of a sub-pixel arrangement structure in a display area of a display panel according to an embodiment.

FIG. 7 is a layout view of a sub-pixel arrangement structure in the display area DA of a display panel according to an embodiment.

Referring to FIG. 7, a plurality of sub-pixels P may be arranged in the display area DA. In the present specification a sub-pixel is a minimum unit that implements an image and denotes an emission area. In the case where an organic light-emitting diode is employed as a display element, the emission area may be defined by an opening of a pixel-defining layer. This is described below.

In an embodiment, the plurality of sub-pixels P may include a red sub-pixel Pr, a green sub-pixel Pg, and a blue sub-pixel Pb. A red sub-pixel Pr, a green sub-pixel Pg, and a blue sub-pixel Pb may respectively implement red, green, and blue colors. In another embodiment, the plurality of sub-pixels P may include a red sub-pixel Pr, a green sub-pixel Pg, a blue sub-pixel Pb, and a white sub-pixel. A red sub-pixel Pr, a green sub-pixel Pg, a blue sub-pixel Pb, and a white sub-pixel may respectively implement red, green, blue, and white colors.

In an embodiment, the plurality of sub-pixels in the display area DA may be arranged in a pentile structure. A plurality of red sub-pixels Pr and a plurality of blue sub-pixels Pb are alternately arranged in a first row 1N, a plurality of green sub-pixels Pg are arranged in a second row 2N adjacent to the first row 1N to be spaced apart from each other with a predetermined interval, a plurality of blue sub-pixels Pb and a plurality of red sub-pixels Pr are alternately arranged in a third row 3N adjacent to the second row 2N, and a plurality of green sub-pixels Pg are arranged in a fourth row 4N adjacent to the third row 3N to be spaced apart from each other with a predetermined interval. Such sub-pixel arrangement is repeated to an N-th row. In this case, a blue sub-pixel Pb and a red sub-pixel Pr may be greater than a green sub-pixel Pg.

A plurality of red sub-pixels Pr and a plurality of blue sub-pixels Pb in the first row 1N and a plurality of green sub-pixels Pg in the second row 2N are alternately arranged. Accordingly, red sub-pixels Pr and blue sub-pixels Pb are alternately arranged in a first column 1M, a plurality of green sub-pixels Pg are arranged in a second column 2M adjacent to the first column 1M to be spaced apart from each other with a predetermined interval, blue sub-pixels Pb and red sub-pixels Pr are alternately arranged in a third column 3M adjacent to the second column 2M, and a plurality of green sub-pixels Pg are arranged in a fourth column 4M adjacent to the third column 3M to be spaced apart from each other with a predetermined interval. Such sub-pixel arrangement is repeated to an M-th column.

Such sub-pixel arrangement structure may be expressed, in which: red sub-pixels Pr are respectively arranged at first and third vertexes among the vertexes of a virtual quadrangle VS with a green sub-pixel Pg centered at the center of the quadrangle, and blue sub-pixels Pb are respectively arranged at second and fourth vertexes, which are the rest of the vertexes. In this case, the virtual quadrangle VS may be variously modified into a rectangle, a rhombus, a square, etc.

In an embodiment, a green sub-pixel Pg may have long sides and short sides. In an embodiment, a long side of a green sub-pixel Pg may face one side of a blue sub-pixel Pb. A short side of a green sub-pixel Pg may face one side of a red sub-pixel Pr.

This sub-pixel arrangement structure is referred to as a pentile matrix structure or a pentile structure. By applying rendering, in which a color of a pixel is represented by sharing the colors of its adjacent sub-pixels, a high resolution may be obtained via a small number of sub-pixels.

Though it is shown in FIG. 7 that a plurality of sub-pixels P are arranged in a pentile matrix structure, the embodiment is not limited thereto. As an example, a plurality of sub-pixels P may be arranged in various configurations such as a stripe structure, a mosaic configuration structure, and a delta configuration structure.

Figure 8A:
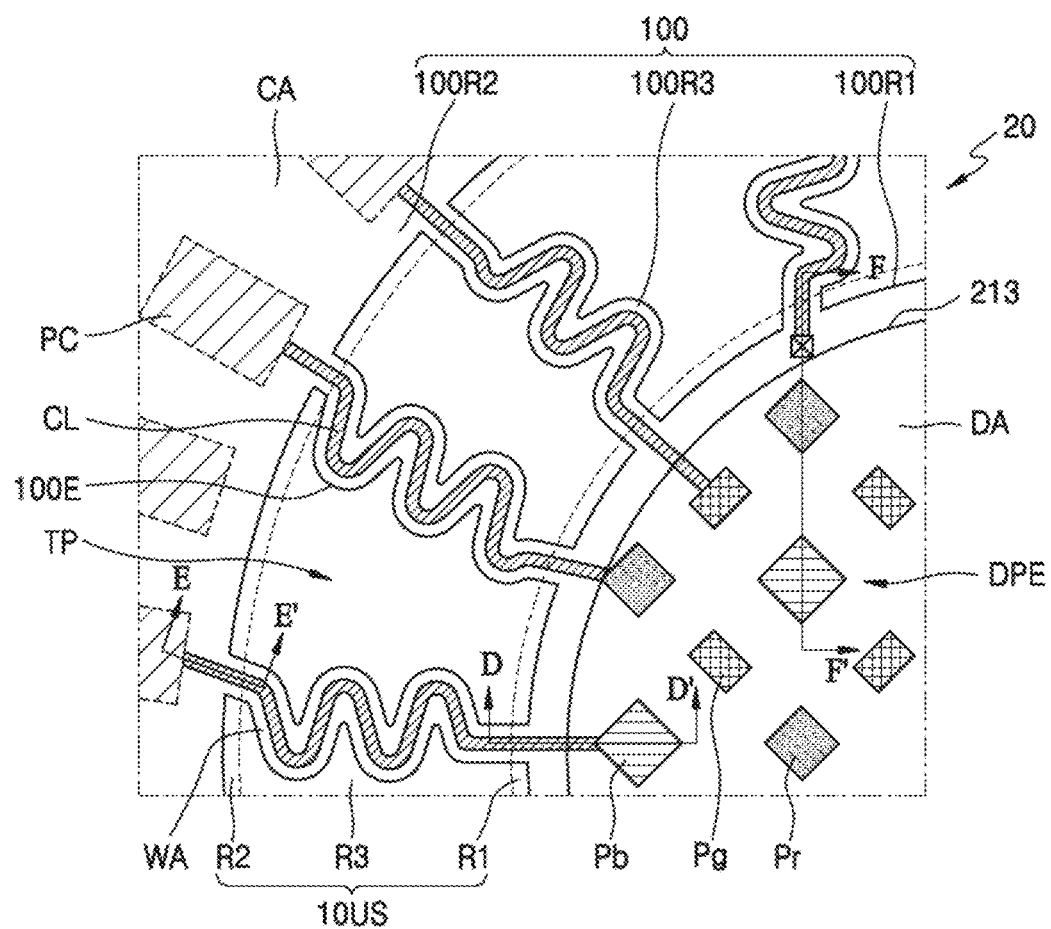
FIGS. 8A and 8B are enlarged plan views of a region C of the display panel of FIG. 4 according to embodiments.
Figure 8B:
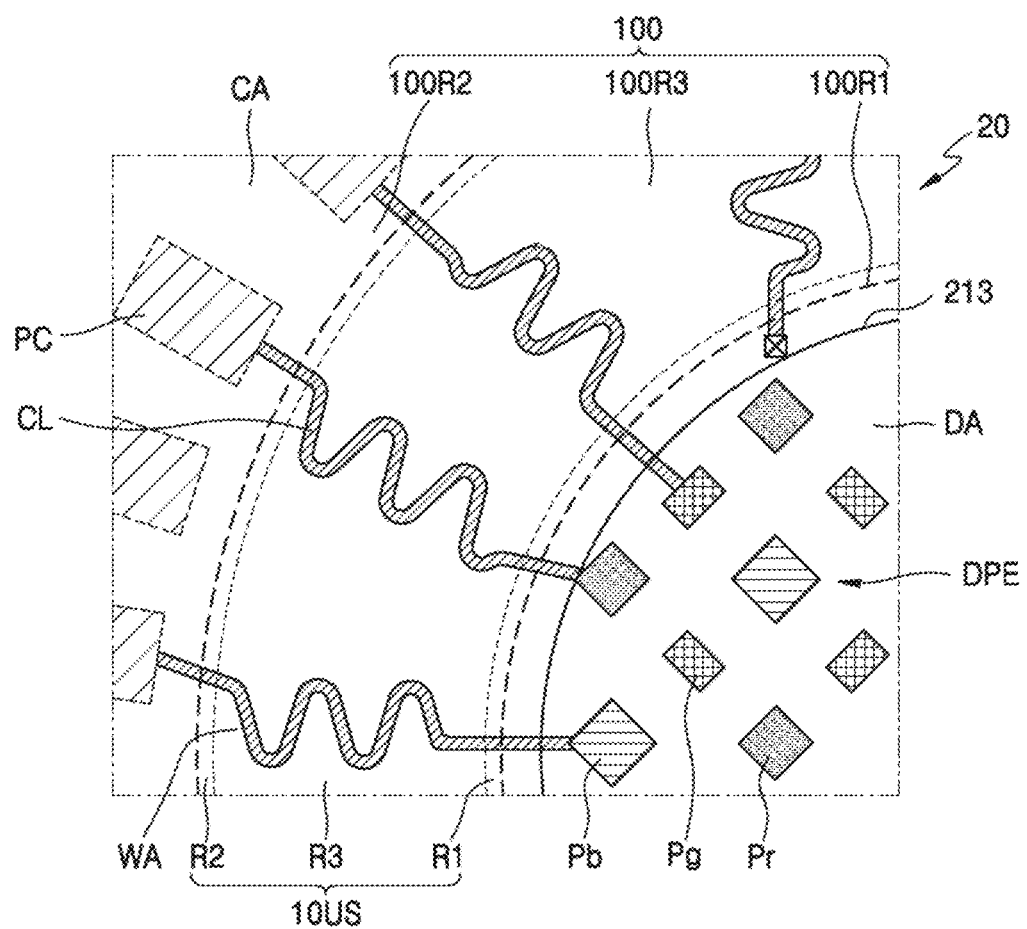

FIGS. 8A and 8B are enlarged plan views of a region C of the display panel 20 of FIG. 4 according to an embodiment.

Referring to FIGS. 8A and 8B, the display panel 20 may be arranged on the upper surface 10US of the first contact lens. The upper surface 10US of the first contact lens 10 may include the first region R1, the second region R2, and the third region R3. In an embodiment, the second region R2 may surround at least a portion of the first region R1. The third region R3 may be arranged between the first region R1 and the second region R2.

The display panel 20 may include the substrate 100, the display element DPE, the connection wiring CL, and the pixel circuit PC. The substrate 100 may be arranged on the upper surface 10US of the first contact lens. In an embodiment, the substrate 100 may include the first substrate region 100R1, the second substrate region 100R2, and the third substrate region 100R3. The first substrate region 100R1 may overlap the first region R1. The second substrate region 100R2 may surround at least a portion of the first substrate region 100R1. In an embodiment, the second substrate region 100R2 may entirely surround the first substrate region 100R1. In another embodiment, the second substrate region 100R2 may surround a portion of the first substrate region 100R1. The second substrate region 100R2 may overlap the second region R2. The third substrate region 100R3 may be arranged between the first substrate region 100R1 and the second substrate region 100R2. The third substrate region 100R3 may overlap the third region R3.

In an embodiment, the first substrate region 100R1 of the substrate 100 may overlap the display area DA of the display panel 20. The second substrate region 100R2 of the substrate 100 may overlap the circuit area CA of the display panel 20. The third substrate region 100R3 of the substrate 100 may overlap the wiring area WA of the display panel 20.

Referring to FIG. 8A, the third substrate region 100R3 may include a plurality of through portions TP spaced apart from each other. The plurality of through portions TP may be portions in which at least a portion of the substrate 100 is removed. In an embodiment, elements of the display panel 20 may not be arranged in the plurality of through portions TP. Accordingly, even when the display panel 20 is bent and/or stretched, the size of stress applied to the display panel 20 in the wiring area WA may be reduced.

The plurality of through portions TP may be defined as the edges of the substrate 100. As an example, one of the plurality of through portions TP may be defined as an edge 100E of the substrate 100. The edge 100E of the substrate 100 may extend from the first substrate region 100R1 to the second substrate region 100R2. A plurality of edges of the substrate 100 that are adjacent to each other may face each other with the through portion TP disposed therebetween.

In an embodiment, an extension direction of the edge 100E of the substrate 100 may change at least twice in the third substrate region 100R3. That is, the edge 100E of the substrate 100 may extend in the first direction, extend in a second direction crossing the first direction, and extend in a third direction crossing the second direction. As an example, the edge 100E of the substrate 100 may extend to have a serpentine shape. As another example, the edge 100E of the substrate 100 may extend in a sinusoidal shape. As another example, the edge 100E of the substrate 100 may extend to have a zigzag shape. The edge 100E of the substrate 100 may have at least one bent portion. Accordingly, while the display panel 20 in the wiring area WA is bent and/or stretched, the amount of stress applied to the display panel 20 may be reduced. In an embodiment, the edge 100E of the substrate 100 may extend in one direction.

Referring to FIG. 8B, the first substrate region 100R1, the substrate region 100R2, and the third substrate region 100R3 may be provided as one body. That is, the substrate 100 in the third substrate region 100R3 may not include the through portion TP.

Referring to FIGS. 8A and 8B, the display element DPE may be arranged in the first substrate region 100R1. In an embodiment, the display element DPE may be provided in a plurality in the first substrate region 100R1. In an embodiment, the plurality of display elements DPE may respectively implement a red sub-pixel Pr, a green sub-pixel Pg, and a blue sub-pixel Pb.

The connection wiring CL may be electrically connected to the display element DPE. The connection wiring CL may be configured to transfer a signal or power to the display element DPE. The connection wiring CL may extend from the first substrate region 100R1 to the second substrate region 100R2. The connection wiring CL may overlap the third substrate region 100R3.

The extension direction of the connection wiring CL may change at least twice in the third substrate region 100R3. That is, the connection wiring CL may extend in a first direction, extend in a second direction crossing the first direction, and extend in a third direction crossing the second direction. As an example, the connection wiring CL may extend in a serpentine shape. As another example, the connection wiring CL may extend in a sinusoidal shape. As another example, the edge of the connection wiring CL may have a zigzag shape. The edge of the connection wiring CL may have at least one bent portion. In an embodiment, as shown in FIG. 8A, in the case where the third substrate region 100R3 includes the through portion TP, the connection wiring CL may extend along an extending direction of the edge 100E of the substrate 100. Accordingly, while the display panel 20 is bent and/or stretched in the wiring area WA, the amount of stress applied to the display panel 20 may be reduced.

The connection wiring CL may be provided in a plurality. The plurality of connection wirings CL may extend from the first substrate region 100R1 to the second substrate region 100R2. In an embodiment, the plurality of connection wirings CL may extend to have a radial shape.

The pixel circuit PC may be electrically connected to the connection wiring CL. The pixel circuit PC may control the display element DPE by signals supplied through the connection wiring CL. The pixel circuit PC may be arranged in the second substrate region 100R2. In an embodiment, the pixel circuit PC may not overlap the first substrate region 100R1. Accordingly, a light transmittance of the first substrate region 100R1 may be improved.

The pixel circuit PC may be provided in a plurality. In an embodiment, the plurality of pixel circuits PC may be respectively connected to a plurality of display elements DPE, respectively. As an example, one of the plurality of pixel circuits PC may be configured to control a red sub-pixel Pr. Another of the plurality of pixel circuits PC may be configured to control a green sub-pixel Pg. The other of the plurality of pixel circuits PC may be configured to control a blue sub-pixel Pb.

In an embodiment, the display element DPE may include a pixel electrode, an emission layer, and an opposite electrode 213. In an embodiment, the opposite electrode 213 may be electrically connected to one of the plurality of connection wirings CL. In an embodiment, the opposite electrode 213 may receive the second power voltage ELVSS (see FIG. 6). The second power voltage ELVSS may be a voltage entirely supplied to the plurality of display elements DPE. In this case, the opposite electrode 213 may be entirely arranged in the display area DA. That is, the opposite electrode 213 of the plurality of display elements DPE may be provided as one body. In this case, the number of connection wirings CL may be reduced.

Figure 9:
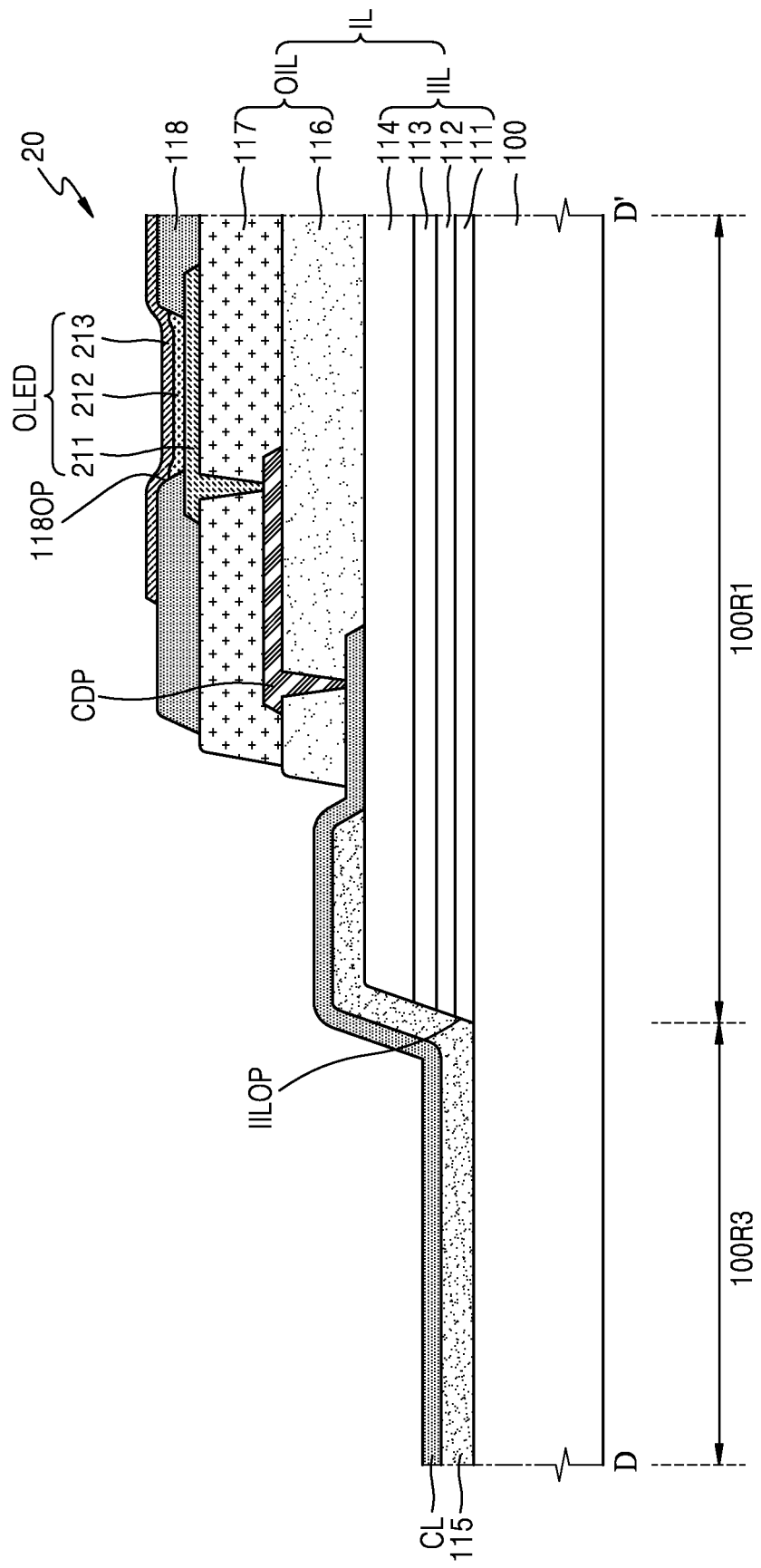
FIG. 9 is a cross-sectional view of the display panel of FIG. 8A, taken along line D-D'.
Figure 10:
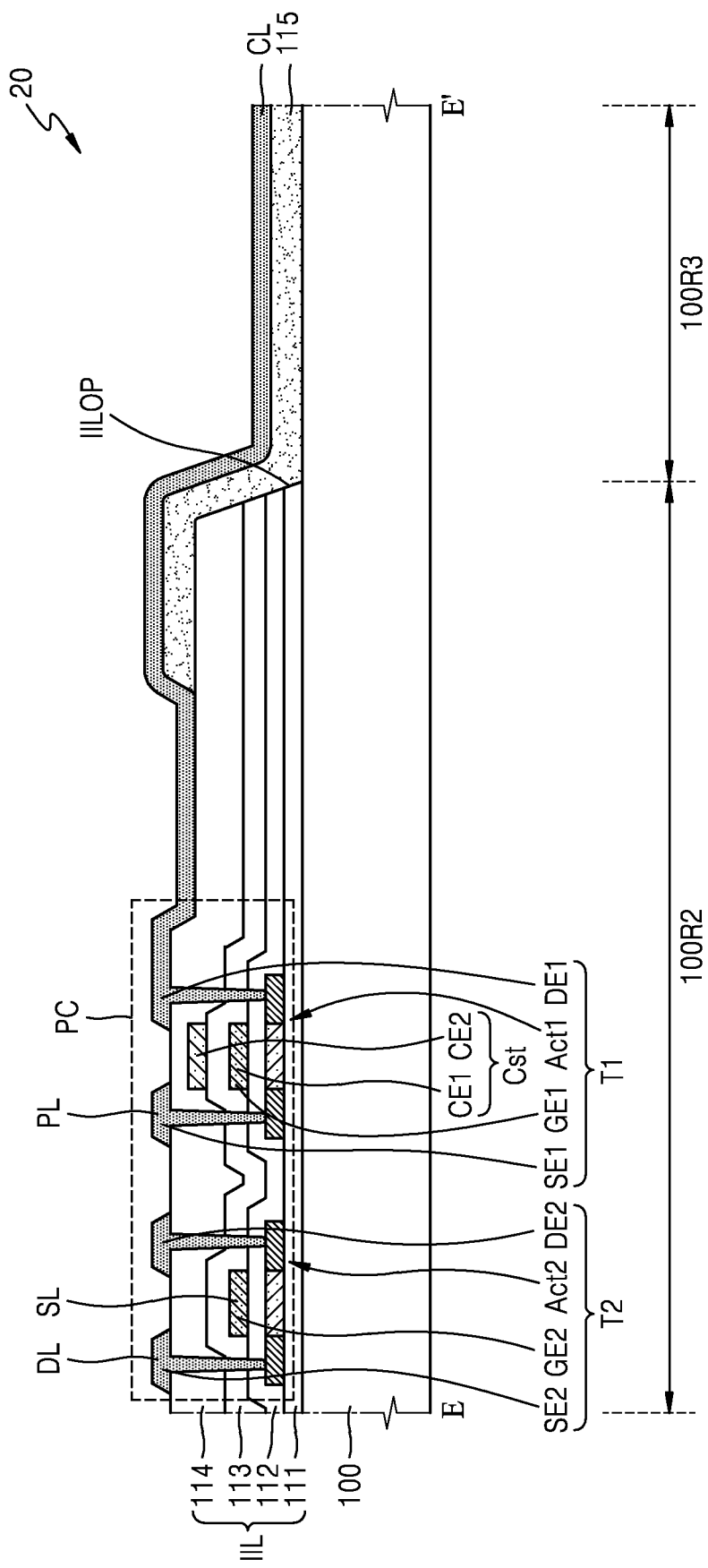
FIG. 10 is a cross-sectional view of the display panel of FIG. 8A, taken along line E-E'.

FIG. 9 is a cross-sectional view of the display panel 20 of FIG. 8A, taken along line D-D'. FIG. 10 is a cross-sectional view of the display panel 20 of FIG. 8A, taken along line E-E'. It is shown in FIGS. 9 and 10 that the substrate 100 extends in one direction. In FIGS. 9 and 10, because the same reference numerals as those of FIG. 5 mean the same members, repeated descriptions thereof are omitted.

Referring to FIGS. 9 and 10, the display panel 20 may include the substrate 100, the insulating layer IL, an organic light-emitting diode OLED as a display element, the connection wiring CL, a conductive pattern CDP, and the pixel circuit PC. The substrate 100 may include the first substrate region 100R1, the second substrate region 100R2, and the third substrate region 100R3.

The insulating layer IL may be arranged on the substrate 100. The insulating layer IL may include an inorganic insulating layer IIL, an organic layer 115, and an organic insulating layer OIL. In an embodiment, the inorganic insulating layer IIL may be arranged on the substrate 100. The inorganic insulating layer IIL may prevent or reduce moisture transmission of moisture and/or foreign substance from the substrate 100 to the organic light-emitting diode OLED as a display element.

The inorganic insulating layer IIL may include an opening IILOP overlapping the third substrate region 100R3. In other words, the inorganic insulating layer IIL may include an opening IILOP exposing the third substrate region 100R3. In other words, the inorganic insulating layer IIL may be arranged in at least one of the first substrate region 100R1 and/or the second substrate region 100R2 and may not be arranged in the third substrate region 100R3. The inorganic insulating layer IIL may include an end portion at the edge of the first substrate region 100R1. The inorganic insulating layer IIL may include an end portion at the edge of the second substrate region 100R2. Accordingly, while the display panel 20 is bent and/or stretched in the third substrate region 100R3, the amount of stress applied to the display panel 20 may be reduced. In an embodiment, the inorganic insulating layer IIL may include a buffer layer 111, a first gate insulating layer 112, a second gate insulating layer 113, and an interlayer insulating layer 114.

The buffer layer 111 may be arranged on the substrate 100. The buffer layer 111 may include an inorganic insulating material such as silicon oxide ($SiO_2$), silicon nitride ($SiN_x$), and/or silicon oxynitride (SiON) and have a single layer or a multi-layer including the above inorganic insulating materials. In an embodiment, the buffer layer 111 may be omitted.

The first gate insulating layer 112 may be arranged on the buffer layer 111. The first gate insulating layer 112 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may be arranged on the first gate insulating layer 112. The second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The interlayer insulating layer 114 may be arranged on the second gate insulating layer 113. The interlayer insulating layer 114 may include silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may include a single layer or a multi-layer including the inorganic insulating materials.

The organic layer 115 may overlap the opening IILOP of the inorganic insulating layer IIL. The organic layer 115 may completely cover the opening IILOP. That is, the organic layer 115 may cover the end portion of the inorganic insulating layer IIL arranged on the edge of the first substrate region 100R1. The connection wiring CL extends from the first substrate region 100R1 to the third substrate region 100R3, the organic layer 115 may reduce a height difference thereof or simultaneously absorb stress that may be applied to the connection wiring CL.

The organic layer 115 may include an organic insulating material such as polyimide, polyamide, an acrylic resin, benzocyclobutene, hexamethyldisiloxane (HMDSO), and a phenolic resin. The organic layer 115 may include a single-layered structure or a multi-layered structure including the organic insulating materials. In an embodiment, the organic layer 115 may be omitted.

The organic insulating layer OIL may be arranged on the inorganic insulating layer IIL. In an embodiment, the organic insulating layer OIL may be arranged in the first substrate region 100R1. In an embodiment, the organic insulating layer OIL may be arranged also in the second substrate region 100R2 and/or the third substrate region 100R3. In an embodiment, the organic insulating layer OIL may include a first organic insulating layer 116 and a second organic insulating layer 117.

The first organic insulating layer 116 may be arranged on the inorganic insulating layer IIL. In an embodiment, the first organic insulating layer 116 may cover a portion of the connection wiring CL. The first organic insulating layer 116 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The second organic insulating layer 117 may be arranged on the first organic insulating layer 116. The second organic insulating layer 117 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, one of the first organic insulating layer 116 and the second organic insulating layer 117 may be omitted.

The display element may be arranged on the organic insulating layer OIL. In an embodiment, the display element may be an organic light-emitting diode OLED. The organic light-emitting diode OLED as a display element may be arranged on the organic insulating layer OIL. The organic light-emitting diode OLED may be arranged in the first substrate region 100R1. In an embodiment, the organic light-emitting diode OLED may be exclusively arranged in the first substrate region 100R1. The organic light-emitting diode OLED may not be arranged in the second substrate region 100R2 and the third substrate region 100R3. The organic light-emitting diode OLED may include a pixel electrode 211, an intermediate layer 212, and the opposite electrode 213.

The pixel electrode 211 may be arranged on the second organic insulating layer 117. The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 211 may further include a layer on/under the reflective layer, the layer including ITO, IZO, ZnO, or $In_2O_3$.

A pixel-defining layer 118 may be arranged on the pixel electrode 211, the pixel-defining layer 118 including an opening 1180P that exposes the central portion of the pixel electrode 211. The pixel-defining layer 118 may include an organic insulating material and/or an inorganic insulating material. The opening 1180P may define an emission area of light emitted from the organic light-emitting diode OLED. As an example, the width of the opening 1180P may correspond to the width of the emission area. In addition, the width of the opening 1180P may correspond to the width of a sub-pixel.

The intermediate layer 212 may include a low-molecular weight material or a polymer material. In the case where the intermediate layer 212 includes a low molecular weight material, the intermediate layer 212 may have a structure in which a hole injection layer (HIL), a hole transport layer (HTL), an emission layer (EML), an electron transport layer (ETL), an electron injection layer (EIL), etc. are stacked in a single or composite configuration. The intermediate layer 212 may include various organic materials such as copper phthalocyanine (CuPc), N, N'-Di (naphthalene-1-yl)-N, N'-diphenyl-benzidine (NPB), and tris-8-hydroxyquinoline aluminum (Alq3). These layers may be formed by vacuum deposition.

In the case where the intermediate layer 212 includes a polymer material, the intermediate layer 212 may generally have a structure including an HTL and an EML. In this case, the HTL may include poly(3,4-ethylenedioxythiophene) (PEDOT), and the EML may include a polymer material such as a polyphenylene vinylene (PPV)-based material and a polyfluorene-based material. The intermediate layer 212 may be formed through screen printing or inkjet printing, laser induced thermal imaging (LITI), etc.

The intermediate layer 212 is not limited thereto and may have various structures. In addition, the intermediate layer 212 may include a layer that is one body over the plurality of pixel electrodes 211 or include a layer patterned to correspond to each of the plurality of pixel electrodes 211.

The opposite electrode 213 may include a conductive material having a low work function. As an example, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 213 may further include a layer on the (semi) transparent layer, the layer including ITO, IZO, ZnO, or $In_2O_3$. The intermediate layer 212 and the opposite electrode 213 may be formed by thermal deposition.

A capping layer (not shown) may be further arranged on the opposite electrode 213, the capping layer being configured to protect the opposite electrode 213. The capping layer may include lithium fluoride (LiF), an inorganic material, and/or an organic material. In addition, in an embodiment, the encapsulation layer ENL (see FIG. 5) may be arranged on the opposite electrode 213.

The connection wiring CL may be electrically connected to the organic light-emitting diode OLED. The connection wiring CL may be configured to transfer a signal or power to the organic light-emitting diode OLED. The connection wiring CL may extend from the first substrate region 100R1 to the second substrate region 100R2. The connection wiring CL may overlap the third substrate region 100R3. In an embodiment, the connection wiring CL may be arranged on the organic layer 115. In an embodiment, the organic insulating layer OIL may be further arranged on the connection wiring CL. In this case, an upper connection wiring (not shown) may be further arranged between the first organic insulating layer 116 and the second organic insulating layer 117.

The connection wiring CL may include a material having excellent conductivity. The connection wiring CL may include a conductive material including molybdenum (Mo), aluminum (Al), copper (Cu), and titanium (Ti) and have a single layer or a multi-layer including the above materials. In an embodiment, the connection wiring CL may have a multi-layered structure of Ti/Al/Ti.

The conductive pattern CDP may be arranged in the first substrate region 100R1. The conductive pattern CDP may electrically connect the organic light-emitting diode OLED as a display element to the connection wiring CL. That is, the conductive pattern CDP may be electrically connected to the organic light-emitting diode OLED. In an embodiment, the conductive pattern CDP may be electrically connected to the pixel electrode 211 of the organic light-emitting diode OLED. The conductive pattern CDP may be electrically connected to the connection wiring CL.

In an embodiment, the conductive pattern CDP may be arranged between the first organic insulating layer 116 and the second organic insulating layer 117. In another embodiment, the conductive pattern CDP may be arranged between the inorganic insulating layer IIL and the organic insulating layer OIL. In another embodiment, the conductive pattern CDP may be arranged on the organic insulating layer OIL.

The conductive pattern CDP may have a higher light transmittance than a light transmittance of the connection wiring CL. In an embodiment, the conductive pattern CDP may include a transparent conductive material. As an example, the conductive pattern CDP may include a transparent conductive oxide (TCO). The conductive pattern CDP may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

In an embodiment, the conductive pattern CDP having a relatively high transmittance may be arranged in the first substrate region 100R1. Accordingly, a light transmittance of the display panel 20 in the first substrate region 100R1 may be maintained relatively high and the organic light-emitting diode OLED may receive a signal or power without deteriorating the transmittance. In addition, the connection wiring CL including a low-resistance material may be arranged in the third substrate region 100R3 that does not need to have a relatively high light transmittance. Accordingly, the connection wiring CL may transfer a signal or power to the organic light-emitting diode OLED while maintaining a low resistance.

The pixel circuit PC may be electrically connected to the connection wiring CL. The pixel circuit PC may be configured to control the organic light-emitting diode OLED through signals supplied through the connection wiring CL.

The pixel circuit PC may be arranged in the second substrate region 100R2. In an embodiment, the pixel circuit PC may not overlap the first substrate region 100R1 in a plan view. Accordingly, a light transmittance of the first substrate region 100R1 may be improved. The pixel circuit PC may include the driving thin-film transistor T1, the switching thin-film transistor T2, and the storage capacitor Cst.

The driving thin-film transistor T1 may include a first semiconductor layer Act1, a first gate electrode GE1, a first source electrode SE1, and a first drain electrode DE1. In an embodiment, the first source electrode SE1 may be electrically connected to the driving voltage line PL. In an embodiment, the driving thin-film transistor T1 may be electrically connected to the switching thin-film transistor T2.

The switching thin-film transistor T2 may include a second semiconductor layer Act2, a second gate electrode GE2, a second source electrode SE2, and a second drain electrode DE2. In an embodiment, the switching thin-film transistor T2 may be electrically connected to the scan line SL and the data line DL, the scan line being configured to transfer a scan signal, and the data line DL being configured to transfer a data signal. In an embodiment, the second gate electrode GE2 may be electrically connected to the scan line SL. The second source electrode SE2 may be electrically connected to the data line DL.

The storage capacitor Cst may include the bottom electrode CE1 and the top electrode CE2. Though not shown, one of the bottom electrode CE1 and the top electrode CE2 may be electrically connected to the second drain electrode DE2. Though not shown, another of the bottom electrode CE1 and the top electrode CE2 may be electrically connected to the driving voltage line PL.

The first semiconductor layer Act1 and the second semiconductor layer Act2 may be arranged on the buffer layer 111. At least one of the first semiconductor layer Act1 and the second semiconductor layer Act2 may include polycrystalline silicon. In addition, at least one of the first semiconductor layer Act1 and the second semiconductor layer Act2 may include amorphous silicon, an oxide semiconductor, or an organic semiconductor. Each of the first semiconductor layer Act1 and the second semiconductor layer Act2 may include a channel region, a drain region, and a source region, the drain region and the source region being respectively arranged on two opposite sides of the channel region.

The first gate electrode GE1 may overlap the channel region of the first semiconductor layer Act1. The second gate electrode GE2 may overlap the channel region of the second semiconductor layer Act2. At least one of the first gate electrode GE1 and the second gate electrode GE2 may include a conductive material including molybdenum (Mo), aluminum (Al), copper (Cu), and/or titanium (Ti) and have a single layer or a multi-layer including the above materials.

The top electrode CE2 may be arranged between the second gate insulating layer 113 and the interlayer insulating layer 114. In an embodiment, the top electrode CE2 may overlap the first gate electrode GE1. The first gate electrode GE1 and the top electrode CE2 overlapping each other with the second gate insulating layer 113 disposed therebetween may constitute the storage capacitor Cst. That is, the first gate electrode GE1 may serve as the bottom electrode CE1 of the storage capacitor Cst.

As described above, the storage capacitor Cst may overlap the driving thin-film transistor T1. In an embodiment, the storage capacitor Cst may not overlap the driving thin-film transistor T1.

The top electrode CE2 may include at least one of aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

The first source electrode SE1, the first drain electrode DE1, the second source electrode SE2, and the second drain electrode DE2 may each be arranged on the interlayer insulating layer 114. At least one of the first source electrode SE1, the first drain electrode DE1, the second source electrode SE2, and the second drain electrode DE2 may include a material having an excellent conductivity. At least one of the first source electrode SE1, the first drain electrode DE1, the second source electrode SE2, and the second drain electrode DE2 may include a conductive material including molybdenum (Mo), aluminum (Al), copper (Cu), and/or titanium (Ti) and have a single layer or a multi-layer including the above materials. In an embodiment, at least one of the first source electrode SE1, the first drain electrode DE1, the second source electrode SE2, and the second drain electrode DE2 may have a multi-layered structure of Ti/Al/Ti.

In an embodiment, at least one thin-film transistor may be electrically connected to the connection wiring CL. As an example, the driving thin-film transistor T1 may be electrically connected to the connection wiring CL. Accordingly, the pixel circuit PC may be electrically connected to the organic light-emitting diode OLED and configured to control the organic light-emitting diode OLED.

Figure 11:
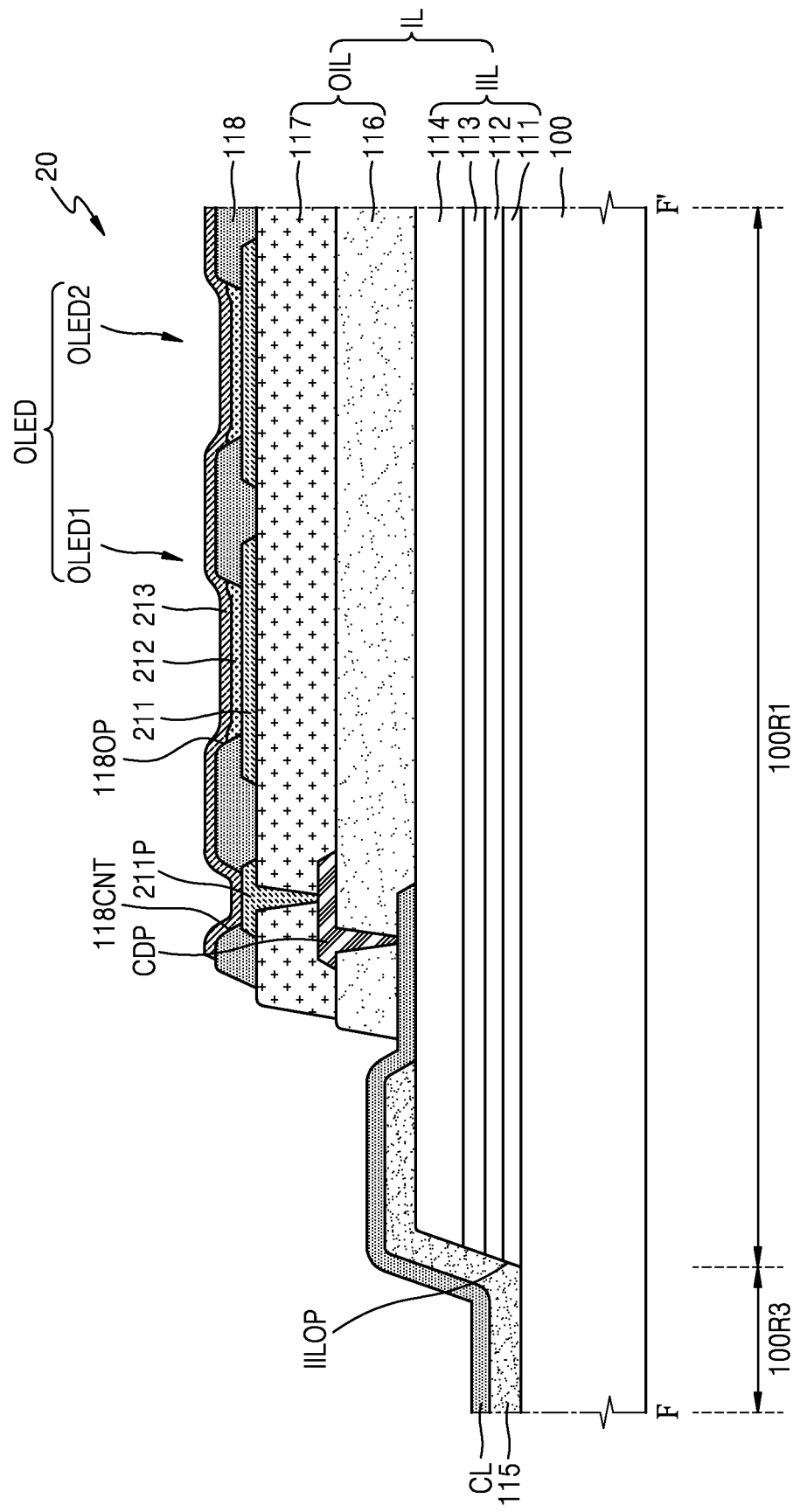
FIG. 11 is a cross-sectional view of the display panel of FIG. 8A, taken along line F-F'.

FIG. 11 is a cross-sectional view of the display panel 20 of FIG. 8A, taken along line F-F. It is shown in FIG. 11 that the substrate 100 extends in one direction. In FIG. 11, because the same reference numerals as those of FIG. 9 mean the same members, repeated descriptions thereof are omitted.

Referring to FIG. 11, the display panel 20 may include the substrate 100, the insulating layer IL, the organic light-emitting diode OLED as a display element, the connection wiring CL, the conductive pattern CDP, and a pixel electrode pattern 211P. The substrate 100 may include the first substrate region 100R1, the second substrate region 100R2, and the third substrate region 100R3.

The organic light-emitting diode OLED as a display element may be arranged on the organic insulating layer OIL. The organic light-emitting diode OLED may be arranged in the first substrate region 100R1. In an embodiment, the organic light-emitting diode OLED may be provided in a plurality in the first substrate region 100R1. As an example, a first organic light-emitting diode OLED1 and a second organic light-emitting diode OLED2 may be arranged in the first substrate region 100R1.

The organic light-emitting diode OLED may include the pixel electrode 211, the intermediate layer 212, and the opposite electrode 213. In an embodiment, the opposite electrode 213 of the plurality of organic light-emitting diodes OLED may be provided as one body.

The pixel electrode pattern 211P may be spaced apart from the pixel electrode 211. In an embodiment, the pixel electrode pattern 211P may be electrically connected to the conductive pattern CDP. As an example, the pixel electrode pattern 211P may be electrically connected to the conductive pattern CDP through a contact hole provided in the second organic insulating layer 117. The pixel electrode pattern 211P may include the same material as that of the pixel electrode 211.

The pixel electrode pattern 211P may be electrically connected to the opposite electrode 213. In an embodiment, the pixel electrode pattern 211P may be exposed through a contact hole 118CNT provided in the pixel-defining layer 118 and electrically connected to the opposite electrode 213.

The opposite electrode 213 may be electrically connected to the connection wiring CL. In an embodiment, the opposite electrode 213 may be electrically connected to the connection wiring CL through the pixel electrode pattern 211P and the conductive pattern CDP. In the case where the opposite electrode 213 is electrically connected to the connection wiring CL through the pixel electrode pattern 211P, the opposite electrode 213 and the connection wiring CL may maintain a low resistance.

In an embodiment, the opposite electrode 213 of the plurality of organic light-emitting diodes OLED may be provided as one body and electrically connected to the connection wiring CL. In this case, the number of connection wirings CL may be reduced.

As described above, the display panel may include the display element, the pixel circuit, and the connection wiring, the display element being arranged in the first substrate region, the pixel circuit being arranged in the second substrate region, and the connection wiring connecting the display element to the pixel circuit. Accordingly, because the pixel circuit is spaced apart from the first substrate region, a light transmittance of the display panel in the first substrate region may be increased, and a smart contact lens including the display panel may implement augmented reality.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate including A smart contact lens comprising:
a first contact lens including an upper surface that includes a first region and a second region surrounding the first region; and
a display panel arranged on the upper surface of the first contact lens,
wherein the display panel includes:
a substrate including a first substrate region and a second substrate region, the first substrate region overlapping the first region, and the second substrate region overlapping the second region;
a display element arranged in the first substrate region;
a connection wiring electrically connected to the display element and extending from the first substrate region to the second substrate region; and
a pixel circuit arranged in the second substrate region, electrically connected to the connection wiring, and including at least one thin-film transistor and a storage capacitor, and
wherein the connection wiring is provided in a plurality and the plurality of connection wirings each extend from the first substrate region to the second substrate region.

2. A display panel comprising:
a substrate including The smart contact lens of claim 1,
wherein the display panel further includes a conductive pattern arranged in the first substrate region and electrically connected to the display element, the conductive pattern is electrically connected to the connection wiring, and a light transmittance of the conductive pattern is greater than a light transmittance of the connection wiring.

3. A display panel comprising:
a substrate including The smart contact lens of claim 1,
wherein the display panel further includes a data line and a scan line, the data line being configured to transfer a data signal, and the scan line being configured to transfer a scan signal, and
wherein the at least one thin-film transistor includes a switching thin-film transistor electrically connected to the data line and the scan line, and a driving thin-film transistor electrically connected to the switching thin-film transistor and the connection wiring.

4. A display panel comprising:
a substrate including The smart contact lens of claim 1,
wherein the upper surface of the first contact lens further includes a third region arranged between the first region and the second region,
wherein the substrate further includes a third substrate region overlapping the third region,
wherein the third substrate region includes a plurality of through portions spaced apart from each other, and
wherein an edge of the substrate that defines at least a portion of one of the plurality of through portions extends from the first substrate region to the second substrate region, and an extension direction of the edge changes at least twice in the third substrate region.

5. A display panel comprising:
a substrate including The smart contact lens of claim 1,
wherein the upper surface of the first contact lens further includes a third region arranged between the first region and the second region,
wherein the substrate further includes a third substrate region overlapping the third region,
wherein the display panel further includes an inorganic insulating layer arranged between the substrate and the display element, and
wherein the inorganic insulating layer includes an opening that overlaps the third substrate region.

6. A display panel comprising:
a substrate including The smart contact lens of claim 1,
further comprising:
a radio frequency antenna arranged in the second region; and
a battery arranged in the second region.

7. A display panel comprising:
a substrate including The smart contact lens of claim 1,
further comprising a second contact lens covering the display panel,
wherein the second contact lens includes a transmission area and a peripheral area, the transmission area overlapping the first region, and the peripheral area overlapping the second region, and
wherein a light transmittance of the second contact lens in the transmission area is greater than a light transmittance of the second contact lens in the peripheral area.

8. A display panel comprising:
a substrate including The smart contact lens of claim 1,
wherein the first contact lens includes elastomer.

9. A display panel comprising:
a substrate including The smart contact lens of claim 1,
wherein the plurality of connection wirings each extend in a serpentine shape from the first substrate region to the second substrate region.

10. A display panel comprising:
a substrate including The smart contact lens of claim 9, wherein the display element is provided in a plurality and the plurality of display elements each include a pixel electrode, an intermediate layer, and an opposite electrode, and
wherein the opposite electrode of each of the plurality of display elements is provided as one body and is electrically connected to one of the plurality of connection wirings.

11. A display panel comprising:
a substrate including a first substrate region, a second substrate region, and a third substrate region, the second substrate region surrounding at least a portion of the first substrate region, and the third substrate region being arranged between the first substrate region and the second substrate region and including a plurality of through portions spaced apart from each other;
a display element arranged in the first substrate region;
a connection wiring electrically connected to the display element and extending from the first substrate region to second substrate region; and
a pixel circuit arranged in the second substrate region, electrically connected to the connection wiring and including at least one thin-film transistor and a storage capacitor,
wherein an edge of the substrate that defines at least a portion of one of the plurality of through portions extends from the first substrate region to the second substrate region, and an extension direction of the edge changes at least twice in the third substrate region.

12. A display panel comprising:
a substrate including The display panel of claim 11, further comprising a conductive pattern arranged in the first substrate region and electrically connected to the display element,
wherein the conductive pattern is electrically connected to the connection wiring and a light transmittance of the conductive pattern is greater than a light transmittance of the connection wiring.

13. A display panel comprising:
a substrate including The display panel of claim 11, further comprising:
a data line configured to transfer a data signal; and
a scan line configured to transfer a scan signal,
wherein the at least one thin-film transistor includes a switching thin-film transistor electrically connected to the data line and the scan line, and a driving thin-film transistor electrically connected to the switching thin-film transistor and the connection wiring.

14. A display panel comprising:
a substrate including The display panel of claim 11, wherein the connection wiring extends in a serpentine shape.

15. A display panel comprising:
a substrate including The display panel of claim 11, wherein the connection wiring is provided in a plurality, and
wherein the plurality of connection wirings each extend from the first substrate region to the second substrate region.

16. A display panel comprising:
a substrate including The display panel of claim 15, wherein the display element is provided in a plurality and the plurality of display elements each include a pixel electrode, an intermediate layer, and an opposite electrode, and
wherein the opposite electrode of each of the plurality of display elements is provided as one body and is electrically connected to one of the plurality of connection wirings.

17. A display panel comprising:
a substrate including The display panel of claim 11, further comprising an encapsulation layer covering the display element and including a first inorganic encapsulation layer, an organic encapsulation layer, and a second inorganic encapsulation layer that are sequentially stacked.

18. A display panel comprising:
a substrate including The display panel of claim 17, wherein the first encapsulation layer and the second encapsulation layer do not overlap the third substrate region.

19. A display panel comprising:
a substrate including The display panel of claim 11, further comprising an inorganic insulating layer arranged between the substrate and the display element,
wherein the inorganic insulating layer includes an opening that overlaps the third substrate region.

20. A display panel comprising:
a substrate including The display panel of claim 19, further comprising an organic layer covering the opening,
wherein the connection wiring is arranged on the organic layer.

* * * * *